(12) United States Patent
Chien et al.

(10) Patent No.: US 9,252,180 B2
(45) Date of Patent: Feb. 2, 2016

(54) BONDING PAD ON A BACK SIDE ILLUMINATED IMAGE SENSOR

(71) Applicant: Taiwan Semiconductor Manufacturing Company, Ltd., Hsin-Chu (TW)

(72) Inventors: Volume Chien, Sinying (TW); I-Chih Chen, Tainan (TW); Ying-Lang Wang, Tai-Chung County (TW); Hsin-Chi Chen, Tainan (TW); Ying-Hao Chen, Tainan (TW); Hung-Ta Huang, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 183 days.

(21) Appl. No.: 13/763,355

(22) Filed: Feb. 8, 2013

(65) Prior Publication Data
US 2014/0225215 A1    Aug. 14, 2014

(51) Int. Cl.
*H01L 21/00* (2006.01)
*H01L 27/146* (2006.01)
*H01L 23/00* (2006.01)
*H04N 5/335* (2011.01)

(52) U.S. Cl.
CPC ............ *H01L 27/1464* (2013.01); *H01L 24/05* (2013.01); *H01L 27/14636* (2013.01); *H01L 27/14683* (2013.01); *H01L 27/14643* (2013.01); *H01L 2924/01013* (2013.01); *H01L 2924/15788* (2013.01); *H04N 5/335* (2013.01)

(58) Field of Classification Search
CPC .............. H01L 27/14687; H01L 2924/01013; H01L 27/14643; H04N 5/335
USPC ................ 257/447, 459; 348/294; 438/59
See application file for complete search history.

(56) References Cited

U.S. PATENT DOCUMENTS

| 2009/0020842 | A1* | 1/2009 | Shiau ............... H01L 21/76898 257/459 |
| 2010/0238331 | A1* | 9/2010 | Umebayashi ..... H01L 27/14632 348/294 |

* cited by examiner

*Primary Examiner* — Dale E Page
(74) *Attorney, Agent, or Firm* — Haynes and Boone, LLP

(57) ABSTRACT

A bonding pad structure for an image sensor device and a method of fabrication thereof. The image sensor device has a radiation-sensor region including a substrate and a radiation detection device, and a bonding pad region including the bonding pad structure. The bonding pad structure includes: an interconnect layer; an interlayer dielectric layer (IDL), both layers extending from under the substrate into the bonding pad region; an isolation layer formed on IDL; a conductive pad having a planar portion and one or more bridging portions extending perpendicularly from the planar portion, through the IDL and isolation layers, and to the interconnect layer; and a plurality of non-conducting stress-releasing structures disposed between the isolation layer and the conductive pad in such a way to adjoin its planar and the bridging portions together for releasing potential pulling stress applied thereon and preventing a conductive pad peeling.

20 Claims, 7 Drawing Sheets

BONDING PAD ON A BACK SIDE ILLUMINATED IMAGE SENSOR

BACKGROUND

Semiconductor image sensors are used to sense radiation such as light. Complementary metal-oxide-semiconductor (CMOS) image sensors (CIS) and charge-coupled device (CCD) sensors are widely used in various applications such as digital still camera or mobile phone camera applications. These devices utilize an array of pixels in a substrate, including photodiodes and transistors that can absorb radiation projected toward the substrate and convert the sensed radiation into electrical signals. A back side illuminated (BSI) image sensor device is one type of image sensor devices. These BSI image sensor devices are operable to detect light from its backside.

The conventional sensor, called the "front side illumination (FSI)" image sensor for these CMOS chips, is constructed in a fashion similar to the human eye, and has a lens at the front, layers of metal having wiring in the middle, and photo detectors on a silicon substrate (which absorbs the light) at the back. These metal layers may not only deflect the light on the sensor, they could also reflect it, reducing the incoming light captured by the photo detectors. By contrast, the back side illuminated sensor has the same elements as FSI, but orients the wiring behind the photo detectors layer by flipping the silicon wafer during manufacturing and then thinning its reverse side so that light will hit the silicon first, and the photo detectors layer without passing through the wiring layer. This change can improve the chance of an input photon being captured from about 60% to over 90%, and the sensitivity per unit area to deliver better low-light shots.

A BSI image sensor device typically has a device region of a wafer and a bond pad region. One of the failure mechanisms known for the bond pad is cratering, which is a mechanical damage to the bonding pad. Cratering happens when the bond pad is peeled off, by some upwardly pulling force, along with a chunk of silicon and in many cases part of active circuit underneath the bond pad, thereby creating a 'hole' or 'crater' on the silicon substrate. It causes a partial or total fracture of the silicon material underneath the bond pad. Bonding time, force and power are critical parameters when dealing with cratering.

Such cratering or bonding pad peeling not only degrades, but seriously damages BSI image sensor device performance. Therefore, it is desirable to provide a method of designing and manufacturing a bond pad structure in an image sensor device, such as BSI, such that any excess stresses that might be potentially applied to the silicon substrate layer may be adequately released or redistributed to prevent the cratering or bond pad peel-off problem.

BRIEF DESCRIPTION OF THE DRAWINGS

Aspects of the present disclosure are understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

Figure 1:
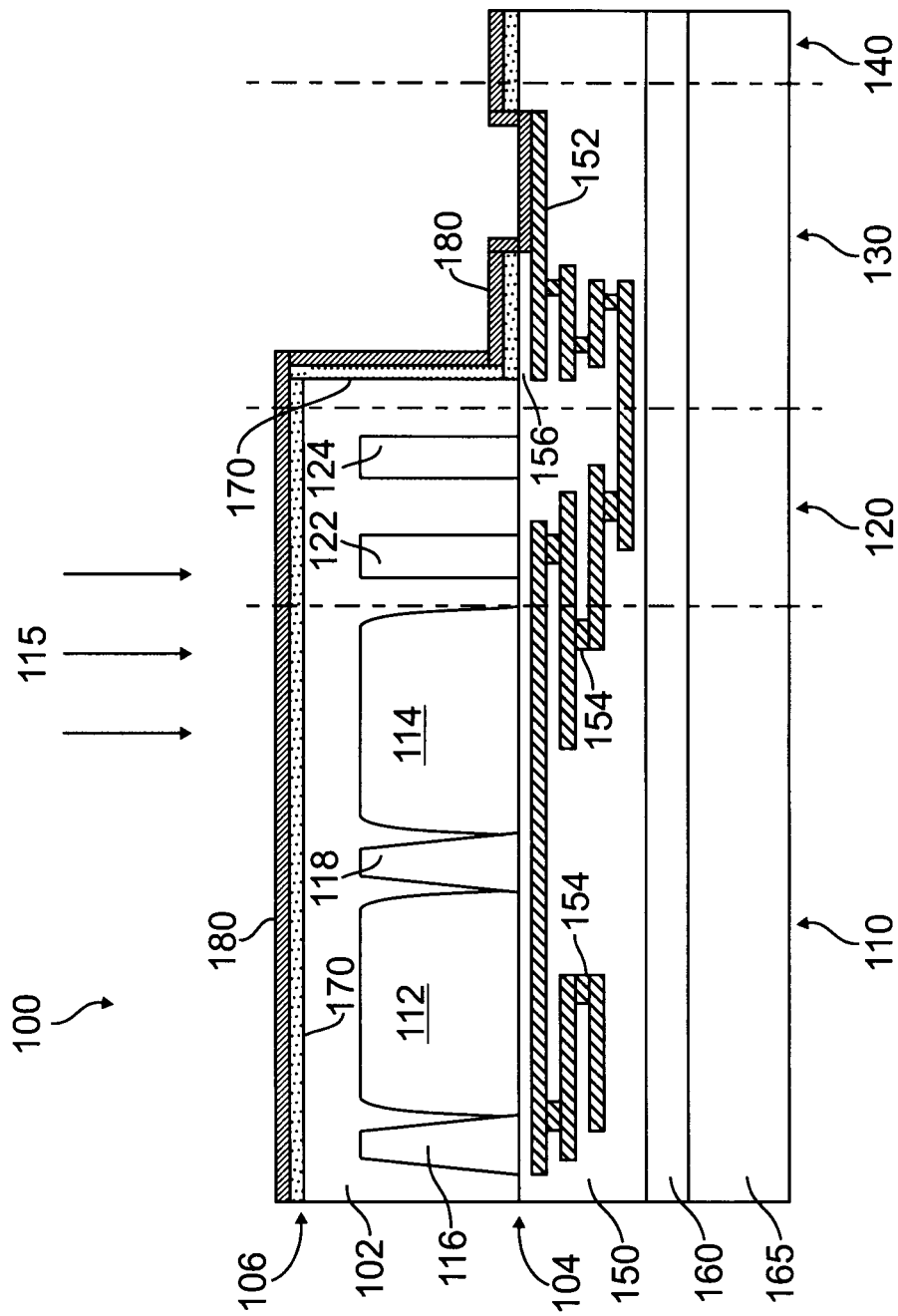
FIG. 1 is a diagrammatic cross-sectional side view of a BSI image sensor device fabricated according to an aspect of the present disclosure.

FIG. 1 is a diagrammatic cross-sectional side view of a BSI image sensor device 100 fabricated according to an aspect of the present disclosure. The image sensor device 100 includes an array or grid of pixels for sensing and recording an intensity of electromagnetic radiation or wave (such as light) directed toward a back-side thereof. The image sensor device 100 may include a charge-coupled device (CCD), complimentary metal oxide semiconductor (CMOS) image sensor (CIS), an active-pixel sensor (APS), or a passive-pixel sensor. The image sensor device 100 further includes additional circuitry and input/outputs that are provided adjacent to the grid of pixels for providing an operation environment for the pixels and for supporting external communication with the pixels. It is understood that FIGS. 1, and 2-5 have been simplified for a better understanding of the inventive concepts of the present disclosure and may not have been drawn to scale.

With reference to FIG. 1, the image sensor device 100 generally comprises a radiation-sensing region 110, a periphery region 120, a bonding pad region 130 (also referred to as an E-pad region), and a scribe line region 140. The dashed lines in FIG. 1 designate the approximate boundaries between the regions 110, 120, 130, and 140. It is understood that these regions 110, 120, 130, and 140 extend vertically above and below the device substrate 102. The radiation-sensing region 110, to be described more in detail herein below, includes silicon substrate that receives radiation and radiation-detection devices formed therein. The periphery region 120 may include other devices 122 and 124 that need to be kept optically dark. For example, the device 122 in an embodiment may be a digital device, such as an application-specific integrated circuit (ASIC) device or a system-on-chip (SOC) device. The other device 124 may be a reference pixel that is used to establish a baseline of an intensity of light for the image sensor device 100. The bonding pad region 130 may include one or more conductive bonding pads or E-pads, through which electrical connections between the image sensor device 100 and outside devices may be established. The structure and fabrication of the bonding pad region 130 according to aspects of the present disclosure may be described more in detail herein through FIGS. 3-5. The scribe line region 140 may be the region that separates one semiconductor die that includes the bonding pad region 130, the periphery region 120, and the radiation-sensing region 110) from an adjacent semiconductor die (not illustrated). The scribe line region 140 is cut in a later fabrication process to separate adjacent dies before the dies are packaged and sold as integrated circuit chips. The scribe line region 140 is cut in such a way that the semiconductor devices in each die are not damaged.

Referring back to FIG. 1, the radiation-sensing region 110 includes a device substrate 102. The device substrate 102 is a silicon substrate doped with a p-type dopant such as boron (for example a p-type substrate) or an n-type dopant such as phosphorous or arsenic (an n-type substrate). The substrate 102 may be comprised of a single semiconducting material such as bulk silicon or any other suitable elementary semiconducting materials, such as germanium in crystal; a compound semiconductor, such as silicon carbide, silicon germanium, gallium arsenic, gallium phosphide, indium phosphide, indium arsenide, and/or indium antimonide; or combinations thereof The substrate 102 may also include an insulator layer on top of the semiconductor layer. The insulator layer comprises any suitable material, including silicon oxide, sapphire, other suitable insulating materials, and/or combinations thereof An exemplary insulator layer may be a buried oxide layer (BOX). The insulator is formed by any suitable process, such as separation by implantation of oxygen (SIMOX), oxidation, deposition, and/or other suitable process. Alternatively, the substrate 102 may further include another semiconductor layer on top of an insulator layer to form a silicon-on-insulator (SOI) substrate, which can be fabricated using wafer bonding, and/or other suitable methods. The substrate 102 may comprise any suitable crystallographic orientation (e.g., a (100), (110), (111), or (001) crystallographic orientation).

The substrate 102 has a front side 104 and a back side 106. The typical thickness of the device substrate 102 may range between about 100 microns (um) and 3000 um. In the device substrate 102, radiation-sensing regions 110 may be formed, which includes radiation-detection devices, pixels 112 and 114. The pixels 112 and 114 are operable to sense radiation, such as an incident light 115, that is projected toward the back side 106 of the device substrate 102. Each of the pixels 112 and 114 may include a photodiode in one embodiment. In another embodiment, the pixels 112 and 114 may include pinned layer photodiodes, photogates, reset transistors, source follower transistors, and transfer transistors.

The pixels 112 and 114, though drawn schematically identically, may be varied from one another to have different junction depths, thicknesses, widths, and so forth. Also, only two pixels are illustrated in FIG. 1 for the sake of simplicity, but it is understood that any number of radiation-detection devices may be implemented in the device substrate 102. In one embodiment shown, the pixels 112 and 114 may be formed by performing a suitable implantation process on the device substrate 102 from the front side 104. The implantation process may include doping the device substrate 102 with a p-type dopant such as boron or an n-type dopant such as phosphorous or arsenic. In another embodiment, the pixels 112 and 114 may also be formed by a diffusion process.

Continuing to refer to FIG. 1, the radiation-sensing region 110 of the device substrate 102 may further include isolation structures—for example, isolation structures 116 and 118— that provide electrical and optical isolation between the pixels 112 and 114. The isolation structures 116 and 118 may include shallow trench isolation (STI) structures that are formed of a dielectric material such as silicon oxide or silicon nitride. The STI structures are formed by etching openings into the substrate 102 from the front side 104 and thereafter filling the openings with the dielectric material. In other embodiments, the isolation structures 116 and 118 may include doped isolation features, such as heavily doped n-type or p-type regions. It is understood that the isolation structures 116 and 118 are formed before the pixels 112 and 114. Again, only two isolation structures 116 and 118 are illustrated in FIG. 1 for the sake of simplicity, but it is understood that any number of isolation structures may be implemented in the device substrate 102 so that the radiation-sensing regions such as pixels 112 and 114 may be properly isolated.

Referring back to FIG. 1, the image sensor device 100 may further have an interconnect structure 150 formed over the front side 104 of the device substrate 102. The interconnect structure 150 may include a plurality of patterned dielectric layers and conductive layers that provide interconnections (e.g., wiring) between the various doped features, circuitry, and input/output of the image sensor device 100. The interconnect structure 150 may further include an interlayer dielectric (ILD) 156 and a multilayer interconnect (MLI) structure. The MLI structure includes contacts, vias and metal lines. For the purposes of illustration, a plurality of conductive metal lines 152 and vias/contacts 154 are shown in FIG. 1. It should be understood that the conductive lines 152 and vias/contacts 154 illustrated are merely exemplary, and the actual positioning and configuration of the conductive lines 152 and vias/contacts 154 may vary depending on design needs.

Still referring to FIG. 1, the image sensor device 100 may further include a buffer layer 160 formed on the interconnect structure 150. In the present embodiment, the buffer layer 160 includes a dielectric material such as silicon oxide. Alternatively, the buffer layer 160 may optionally include silicon nitride. The buffer layer 160 is formed by CVD, PVD, or other suitable techniques. The buffer layer 160 may be planarized to form a smooth surface by a chemical mechanical polishing (CMP) process.

Thereafter, a carrier substrate 165 may be further bonded with the device substrate 102 through the buffer layer 160, so that processing the back side 106 of the device substrate 102 can be performed. The carrier substrate 165 in the present embodiment is similar to the substrate 102 and includes a silicon material. Alternatively, the carrier substrate 165 may include a glass substrate or another suitable material. The carrier substrate 165 may be bonded to the device substrate 102 by molecular forces—a technique known as direct bonding or optical fusion bonding—or by other bonding techniques known in the art, such as metal diffusion or anodic bonding.

The buffer layer 160 provides electrical isolation between the device substrate 102 and the carrier substrate 165. The carrier substrate 165 provides protection for the various features formed on the front side 104 of the device substrate 102, such as the pixels 112 and 114. The carrier substrate 165 also provides mechanical strength and support for processing the back side 106 of the device substrate 102 as discussed below. After bonding, the device substrate 102 and the carrier substrate 165 may optionally be annealed to enhance bonding strength.

Still referring to FIG. 1, a thinning process may be performed to thin the device substrate 102 from the backside 106.

The thinning process may include a mechanical grinding process and a chemical thinning process. A substantial amount of substrate material may be first removed from the device substrate 102 during the mechanical grinding process. Afterwards, the chemical thinning process may apply an etching chemical to the back side 106 of the device substrate 102 to further thin the device substrate 102 to a thickness desired. In one embodiment, the thickness may be less than 5 um, even down to 2-3 um. The thickness of the device substrate 102 may be implemented depending on the type of application and design requirements of the image sensor device 100.

After thinning the substrate to a desired thickness, in order to construct a bonding pad structure in the bonding pad region 130, part of the substrate 102 in the bonding pad region 130 and the scribe line region 140 is further removed by an etching process, starting from the back side 106 of the substrate, until an interlayer dielectric layer (ILD) 156 on the interconnect structure 100 is exposed. FIG. 1 shows the bonding pad region 130 after the substrate 102 has been already removed by a proper etching process. After removing a portion of the substrate 102 as desired. After then, an oxide layer 170 is formed over the back side 106 of the device substrate 102, and also over the exposed surface of the ILD layer 156 in the bonding pad region 130. Thereafter, a portion of the bonding pad region 130 is etched to expose a portion of the top-most conductive line in the interconnect structure 150. A bonding pad will be formed on the exposed conductive line. Then, a conductive layer 180 is formed over the oxide layer 170 from the backside 106 and over the conductive line in the bonding pad region 130. A portion of the conductive layer 180 comes into physical contact with the top-most conductive line in the interconnect structure 100 through vias. This portion of the conductive layer will be patterned into a bonding pad later. Detailed description of the etching process, forming the oxide layer 170, and forming the conductive layer 180 will be provided herein below when describing the process of constructing a bonding pad structure in embodiments of the present disclosure.

Thereafter, though not illustrated in FIG. 1, an additional processing may be performed to complete the fabrication of the image sensor device 100. For example, a passivation layer may be formed around the image sensor device for protection (for example against dust or humidity). Color filters may be formed within the radiation-sensing region 110. The color filters may be positioned such that the incoming light is directed thereon and therethrough. The color filters may include a dye-based (or pigment based) polymer or resin for filtering a specific wavelength band of the incoming light, which corresponds to a color spectrum (e.g., red, green, and blue). Thereafter, micro-lenses are formed over the color filters for directing and focusing the incoming light toward specific radiation-sensing regions in the device substrate 102, such as pixels 112 and 114. The micro-lenses may be positioned in various arrangements and have various shapes depending on a refractive index of material used for the micro-lens and distance from a sensor surface. It is also understood that the device substrate 102 may also undergo an optional laser annealing process before the forming of the color filters or the micro-lenses.

Figure 2A:
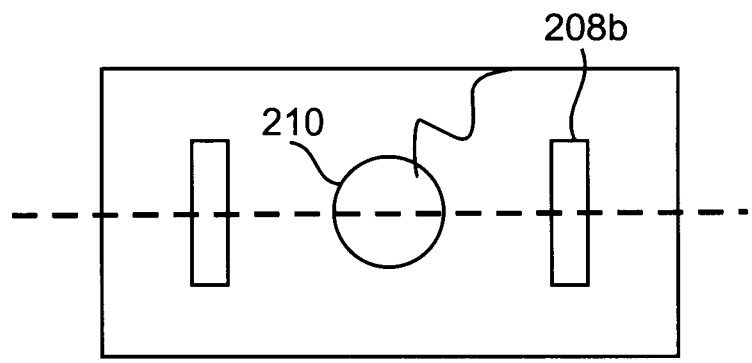
FIGS. 2A-2C are top cross-sectional, and side cross-sectional schematic views, respectively, of the conventional bonding pad structure in the current art for an image sensor device.
Figure 2B:
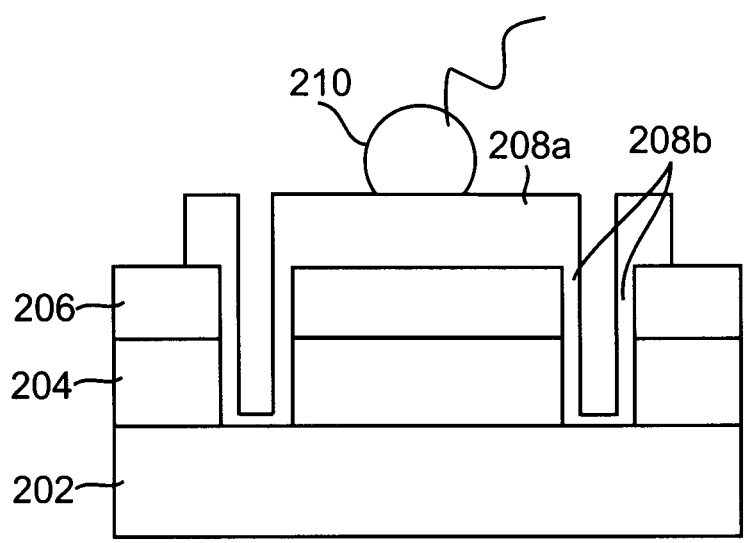
Figure 3:
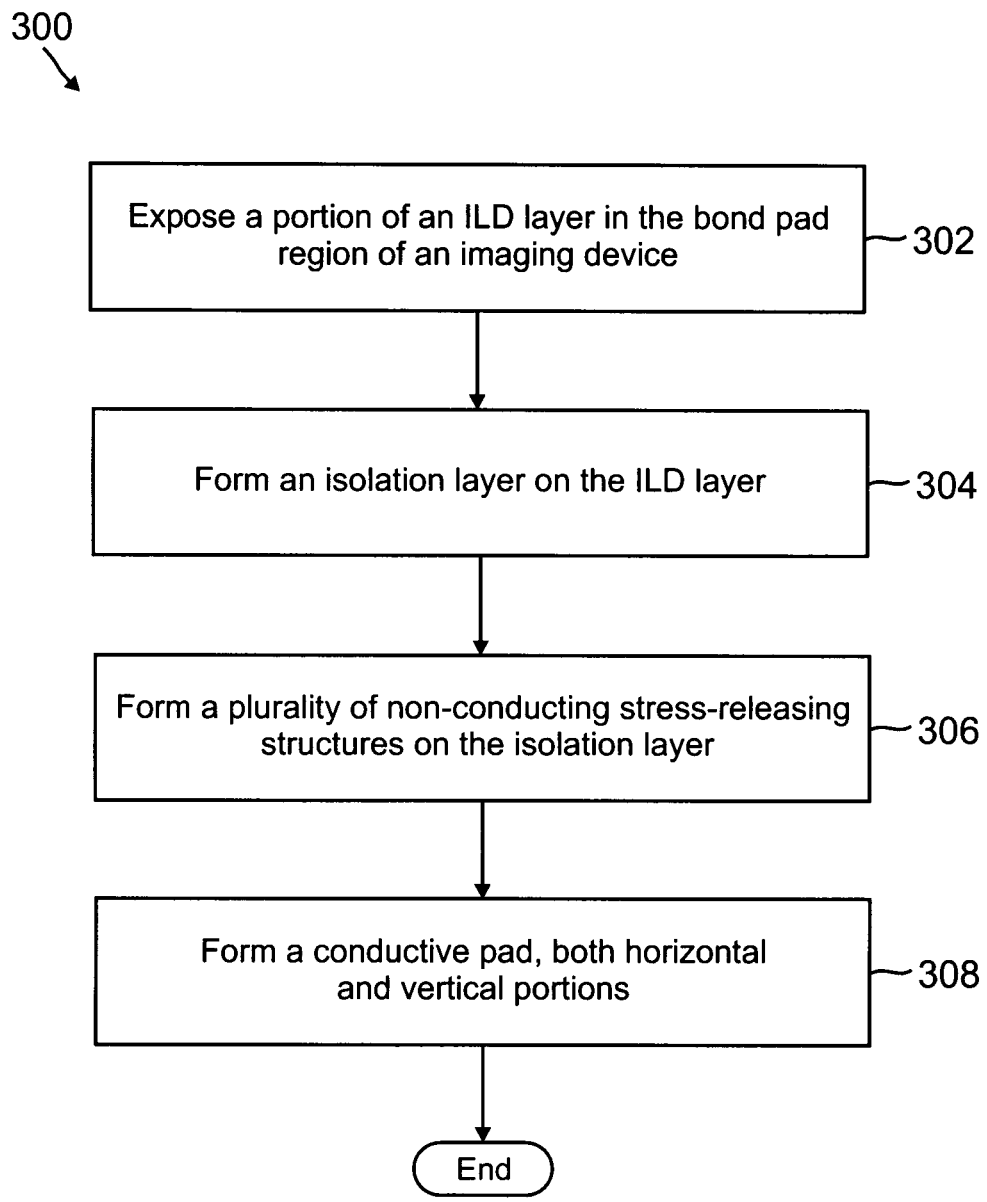
FIG. 3 is a flowchart of a method for fabricating a bonding pad structure for an image sensor device, such as the one illustrated in FIG. 1, according to an aspect of the present disclosure.
Figure 4A:
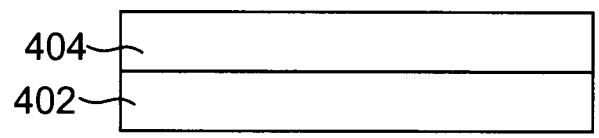
FIGS. 4A-4H are schematic diagrams for the steps performed in the method illustrated in FIG. 3, in an aspect of the present disclosure.
Figure 4B:
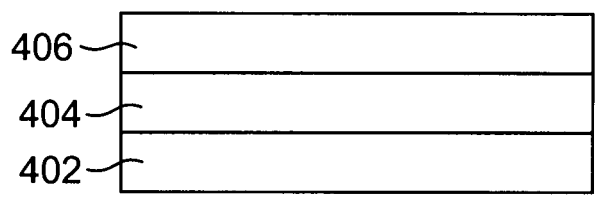

In the bonding pad region 130 of the image sensor device 100, a bonding pad structure is formed. FIGS. 2A-2B illustrate the bonding pad structures used in the current art that has a bonding pad peeling-off problem, and in comparison, FIGS. 3-4H illustrate a method for fabricating a bonding pad structure in aspects of the present disclosure that solves such a problem and FIG. 5A-5B illustrate so fabricated structure.

FIGS. 2A and 2B show top cross-sectional, and side cross-sectional schematic views, respectively, of the conventional bonding pad structure 200 in the current art for an image sensor device. The conventional bonding pad structure 200 includes a multilayer interconnect layer 202, an interlayer dielectric (ILD) layer 204, a dielectric layer such as a shallow trench isolation (STI) 206, and a conductive bonding pad comprising a horizontal planar portion 208a disposed upon the STI layer 206 and one or more vertical portions (vias) 208b that extends perpendicularly downward from the horizontal portion 208a to reach the multilayer interconnect layer 202 through the STI layer 206 and ILD layer 204. The conductive bonding pad 208a and 208b is typically made of aluminum (Al), copper (Cu), or their combination (AlCu).

Upon the planar portion of the conductive pad 208a, a process of wire bonding is performed for providing electrical connection between the chip (image sensor device) and the external leads of the semiconductor device by using very fine bonding wires. The wire used in wire bonding is usually made either of gold (Au) or aluminum (Al), although Cu wire bonding is starting to gain a foothold in the semiconductor manufacturing industry. One common wire bonding process is a gold or copper ball bonding. During this process, a copper, aluminum, or gold ball is first formed by melting the end of a wire, which is held by a bonding machine known as a capillary, through electronic flame-off (EFO). This free-air ball typically has a diameter ranging from 1.5 to 2.5 times the wire diameter. The free-air ball is then brought into contact with the bonding pad. Adequate amounts of pressure, heat, and ultrasonic forces are then applied to the ball for a specific amount of time, forming the initial metallurgical weld between the ball and the bonding pad as well as deforming the ball bond itself into its final shape.

The bonding between the bonding pad and the ball must be strong and stable enough to withstand any external disturbance or force. If the bond fails, it will cause a ball lifting, a detachment of the ball from the bonding pad, or a cratering, caused by a peeling of the bonding pad. One of several available time-zero tests for wire bond strength and quality is the Wire Pull Testing (WPT), or bond pull testing, which consists of applying a perpendicularly upward force under the wire to be tested via a pull hook, effectively pulling the wire away from the die, using a special equipment commonly referred to as a wire pull tester (or bond pull tester), and measure the force, in grams-force, at which the wire or the bond fails. This breaking force is usually expressed.

Figure 2C:
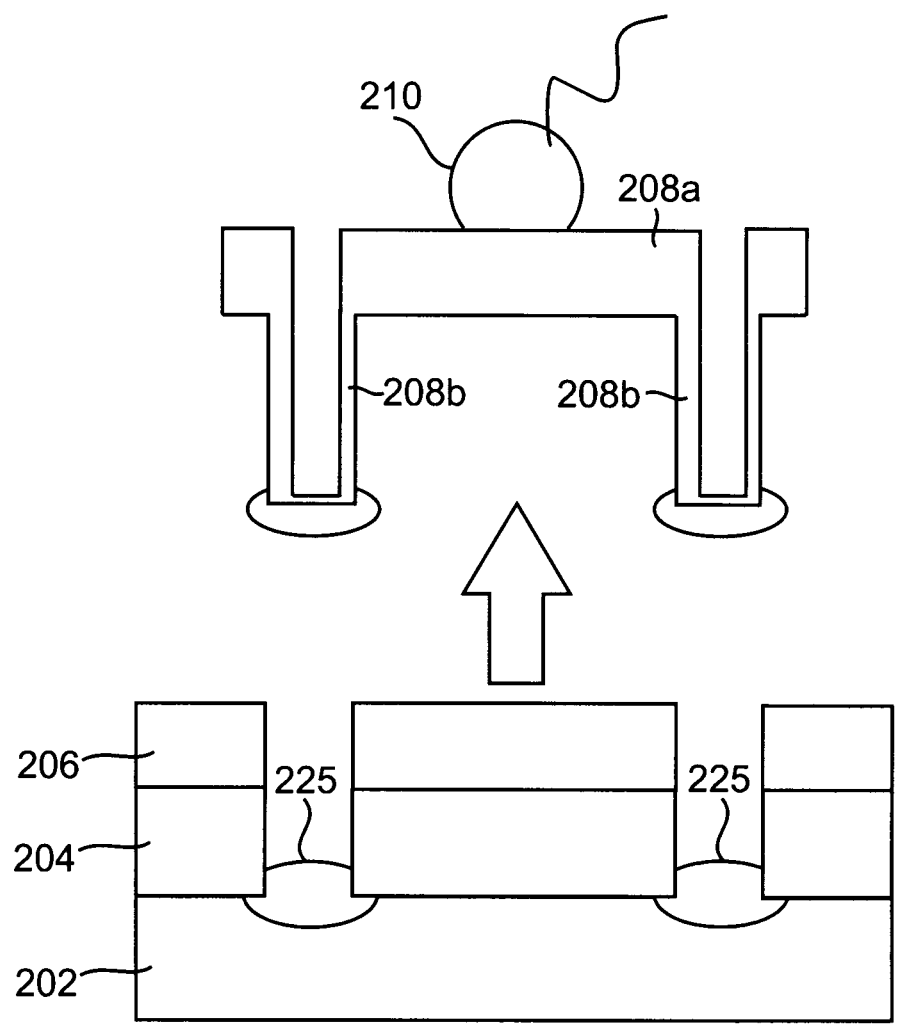

This conventional bonding pad structure, illustrated in FIGS. 2A and 2B, has, particularly, a problem of bonding pad peeling-off or a cratering under such a wire pull testing. FIG. 2C schematically illustrates such a problem. As pull force is applied to the ball 210 and the ponding pad 208a and 208b by, for instance, pulling the wire 212 upward, the pad 208a and 208b will be peeled off from the STI layer 206 at sufficiently large force. But when the ponding pad 208a and 208b is peeled, it comes off not only by itself, but also together with a chunk 220 of silicon or part of metal conducting lines, which become dislodged from the multilayer interconnect layer 202 and attached to the vertical portions of the bonding pad 208b, leaving behind craters or holes 225 in the multilayer interconnect layer 202. The common causes of cratering may be due to excessive probing or overbonding, i.e., the situation wherein the bonding tool has transmitted excessive stresses to the bond pad during wire bonding. The excessive pull force or stress may pass the horizontal ponding pad 208a, be transferred through the vertical portion (vias) 208b, and become centralized on the end of the vertical portions of the bonding pad 208b to peel off the inner structure of the multilayer interconnect layer 202.

Such a cratering or peeling-off problem may happen not only to a bond pad structure that uses a bond ball process described above, but also to a structure that uses aluminum wedge wire bonding. In the wedge bonding process, a clamped aluminum wire is brought in contact with the aluminum bond pad. Ultrasonic energy is then applied to the wire for a specific duration while being held down by a specific amount of force, forming a wedge bond between the wire and the bond pad.

Therefore, it is desired to provide a structure for bonding pad that is designed to spread out the stress so that it may not be focused on the bonding pad only to cause to peeling-off problem that contaminates or destroys important electric connections contained in a multilayer interconnect layer.

FIG. 3 is a flowchart of a method 300 for fabricating a bonding pad structure for an image sensor device, such as a back-side illuminated (BSI) image sensor, according to an aspect of the present disclosure. In describing method 300 herein, FIGS. 4A-4H are referred to, which show schematically the steps performed in the method 300 in an aspect of the present disclosure. The image sensor device, for which the method 300 is practiced, comprises a radiation-sensor region having a substrate and a radiation detection device formed in it; and a bonding pad region having a stack of an interconnect layer and an interlayer dielectric layer that are extending from the radiation-sensor region into the bonding pad region as schematically shown in FIG. 1.

The method 300 begins with a step 302 of exposing a portion of the interlayer dielectric (ILD) layer in the bond pad region of an imaging device for constructing the bonding pad structure thereupon. As illustrated in FIG. 1, the image sensor device has an interconnect structure formed over a front side the device substrate, which may be extending all the way across the radiation-sensor region as well as the bonding pad region. The interconnect structure may include multi-interconnect layers and an interlayer dielectric (ILD) layer formed upon the multi-interconnect layers. FIG. 4A shows the schematic side cross-sectional view of the interconnect structure 400 in the bond pad region, comprising multi-interconnect layers 402 and an interlayer dielectric (ILD) layer 404. The interlayer dielectric (ILD) layer 404 is shown to be exposed at the step 302 by having removing a substrate that had been above the interlayer dielectric (ILD) layer 404 by an etching process.

The multi-interconnect layers 402 may have patterned dielectric layers and conductive interconnects, such as contacts, vias and metal lines, that provide interconnections between the various doped features, circuitry, and input/output of the image sensor device. The interconnects are made of conductive materials such as aluminum, aluminum/silicon/copper alloy, titanium, titanium nitride, tungsten, polysilicon, metal silicide, or combinations thereof, being referred to as aluminum interconnects. Aluminum interconnects may be formed by a process including physical vapor deposition (PVD) (or sputtering), chemical vapor deposition (CVD), atomic layer deposition (ALD), or combinations thereof. Other manufacturing techniques to form the aluminum interconnect may include photolithography processing and etching to pattern the conductive materials for vertical connection (for example, vias/contacts) and horizontal connection (for example, conductive metal lines). Alternatively, a copper multilayer interconnect may be used to form the metal patterns. The copper interconnect may include copper, copper alloy, titanium, titanium nitride, tantalum, tantalum nitride, tungsten, polysilicon, metal silicide, or combinations thereof. The copper interconnect may be formed by a technique including CVD, sputtering, plating, or other suitable processes.

The interlayer dielectric (ILD) layer 404 is formed between the interconnects and upon the interconnect layers for electric isolation. A dielectric material is deposited to fill the spaces between interconnects and over them to form the ILD layer. In one embodiment, the dielectric material may be the typical undoped and doped silicon dioxide (SiO2), silicon oxynitride (SiON), and silicon nitride (Si3N4), or other high-k dielectric material such as a hafnium oxide ($HfO_2$), HfSiO, HfSiON, HfTaO, HfTiO, HfZrO, zirconium oxide, aluminum oxide, hafnium dioxide-alumina ($HfO_2$—$Al_2O_3$) alloy, titanium nitride (TiN). In another embodiment, the dielectric material may be low k (dielectric constant) material, having k value less than 3, such as fluorinated silica glass, hydrogen silsesquioxane, carbon doped silicon oxide, amorphous fluorinated carbon, Parylene, B-stage polymers, BCB (bis-benzocyclobutenes), PTFE (Teflon), SiLK (Dow Chemical, Midland, Mich.), SiOC (silicon oxycarbide) polymers, polyimides/Fluorinated, Poly(arylene ether) PAE. In still another embodiment, the dielectric material may be an ultra-low k dielectric material including a porous version of an existing dielectric material, such as Porous MSQ, Porous PAE, Porous SiLK, or Porous $SiO_2$. After the deposition, the upper portions of deposited interlayer dielectric layer may be removed and/or flattened by, in an embodiment, a Chemical Mechanical Polishing/Planarization ("CMP") so that it may be attached to the front side of the substrate of the image sensor device.

As mentioned above, exposing the ILD layer 404 for constructing the bonding pad structure in the bond pad region at step 302 involves removing the portion of the substrate that was initially extending in the bond pad region beyond the radiation sensor region of the device, starting from the back side of the substrate, by an etching process until the interlayer dielectric layer lying under the front side of the substrate becomes exposed. When etching the substrate, any known etching processes may be used, such as wet etching, dry etching, or plasma etching, but when an anisotropic etching is desired, a plasma etching may be used. In one embodiment, etching the polymer may use a mixture of process gases. For instance, oxygen and tetrafluoromethane (CF4), when mixed together for use in plasma etching, create the oxyfluoride ion (OF—). The oxyfluoride ion is a powerful etching agent for polymeric substances. This ion is particularly adept at cutting the carbon-carbon molecular bonds in the polymer backbone and removing the molecule quickly. The etchants that may be used for polymer etching may include, but are not limited to, wet etchants such as potassium hydroxide (KOH), ethylene diamine and pyrocatechol (EDP), or Tetramethylammonium hydroxide (TMAH), or plasma etchants such as $Cl_2$, $CCl_4$, $SiCl_2$, $BCl_3$, $CCl_2F_2$, $CF_4$, $SF_6$, or $NF_3$.

Referring back to FIG. 3, now at step 304, an isolation layer is formed on the exposed portion of the interlayer dielectric layer. FIG. 4B shows the isolation layer 406 formed upon the interlayer dielectric layer 404, exposed in the previous step of 302. The isolation layer 406 may be formed by utilizing isolation technology, such as local oxidation of silicon (LOCOS) or shallow trench isolation (STI), wherein a dielectric material may be deposited by spin-on coating or spin-on dielectric (SOD) process, CVD, or any other suitable deposition processes upon the interlayer dielectric layer 404. After the deposition, the upper portions of deposited dielectric layer may be removed by, in an embodiment, a Chemical Mechanical Polishing/Planarization ("CMP"). The dielectric material used for the isolation layer 406 may be the typical undoped and doped silicon dioxide ($SiO_2$), silicon oxynitride (SiON), silicon nitride ($Si_3N_4$), high-density plasma (HDP) oxides, TEOS oxides, high-k dielectric material such as a hafnium oxide ($HfO_2$), HfSiO, HfSiON, HfTaO, HfTiO, HfZrO, zirconium oxide, aluminum oxide, hafnium dioxide-alumina ($HfO_2$—$Al_2O_3$) alloy, titanium nitride (TiN), or any other suitable materials, or combinations thereof. In some embodiments, the isolation layer 406 may have a multi-layer structure such as a thermal oxide liner layer filled with silicon nitride or silicon oxide.

It is also understood that a bottom anti-reflective coating (BARC) layer may be further formed over the isolation layer 406, and an additional oxide layer may be formed over the BARC layer. However, for reasons of simplicity, the BARC layer and the additional oxide layer are not illustrated herein.

Referring back to FIG. 3, at step 306, a plurality of non-conducting stress-releasing structures is formed on the isolation layer by suitable multiple processes as schematically described in FIGS. 4C-4G. Such processes may include deposition, photolithography patterning, and etching processes. The photolithography patterning processes may include photoresist coating (e.g., spin-on coating), soft baking, mask aligning, exposure, post-exposure baking, developing the photoresist, rinsing, drying (e.g., hard baking), other suitable processes, and/or combinations thereof. Alternatively, the photolithography exposing process may be implemented or replaced by other proper methods such as mask-less photolithography, electron-beam writing, and ion-beam writing.

Figure 4C:
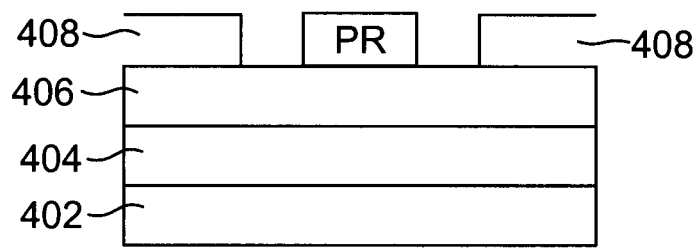
Figure 5A:
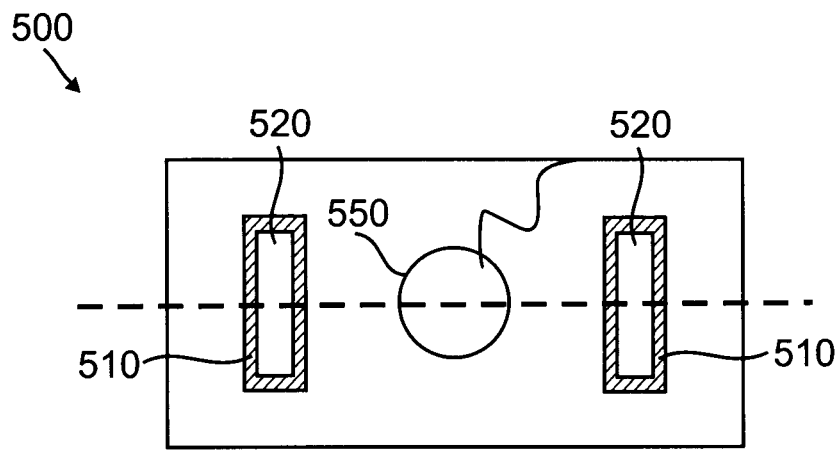
FIGS. 5A and 5B are top cross-sectional, and side cross-sectional schematic views, respectively, of a bonding pad structure made in an aspect of the present disclosure.
Figure 5B:
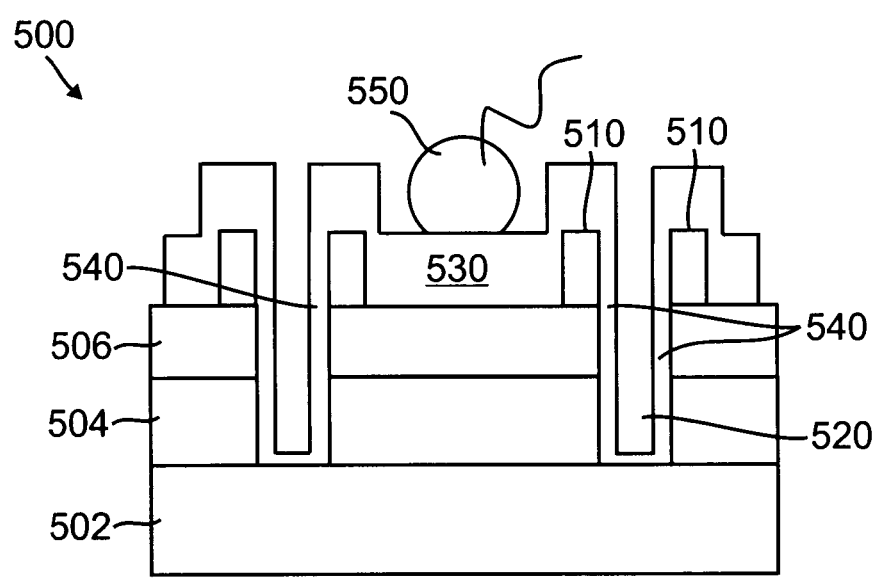

More particularly, a photoresist ("PR") layer 408 is coated upon the isolation layer 406 for patterning as shown in FIG. 4C. The photoresist may be any suitable material used in the art, such as Poly (methyl methacrylate) (PMMA), Poly (methyl glutarimide) (PMGI), Phenol formaldehyde resin (DNQ/Novolac), SU-8, and may be either positive or negative photoresist. These materials are all applied as a liquid and, generally, spin-coated to ensure uniformity of thickness. After prebaking, the photoresist layer is exposed to an ultraviolet (UV), deep ultraviolet (DUV) or electron beam through a pattern via a photomask. The exposure to light causes a chemical change that allows some of the photoresist to be removed by a special solution, called "developer" by analogy with photographic developer. For positive photoresist, the most common type, the exposed part becomes soluble in the developer. After going through a post-exposure baking process, the remaining (unexposed) parts form a mask that resists etching. FIG. 4(b) shows such photoresist masks 408 after the exposure, developing, and post-exposure baking process.

Figure 4D:
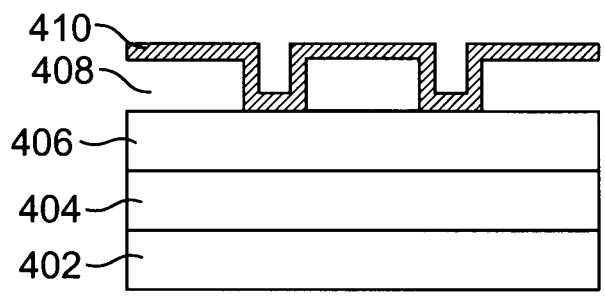

Next, a dielectric material is deposited, as shown in FIG. 4D, upon the photoresist masks 408 and the isolation layer 406 to form a dielectric layer 410, which will be shaped into the plurality of non-conducting stress-releasing structures later. The dielectric material may be deposited by any suitable deposition processes including spin-on coating or spin-on dielectric (SOD) process, CVD, or PVD. The dielectric material used for stress-releasing structures may be the same material as the shallow trench isolation (STI) layer such as the typical undoped and doped silicon dioxide ($SiO_2$), silicon oxynitride (SiON), silicon nitride ($Si_3N_4$), silicon carbonate (SiC), high-density plasma (HDP) oxides, TEOS oxides, high-k dielectric material such as a hafnium oxide ($HfO_2$), HfSiO, HfSiON, HfTaO, HfTiO, HfZrO, zirconium oxide, aluminum oxide, hafnium dioxide-alumina ($HfO_2$—$Al_2O_3$) alloy, titanium nitride (TiN), or any other suitable materials, or combinations thereof. While depositing the dielectric material, the thickness of the layer 410 may be controlled to have a suitable value to provide sufficient structural and mechanical strength and stability when it is subsequently shaped into the non-conducting stress-releasing structures.

Figure 4E:
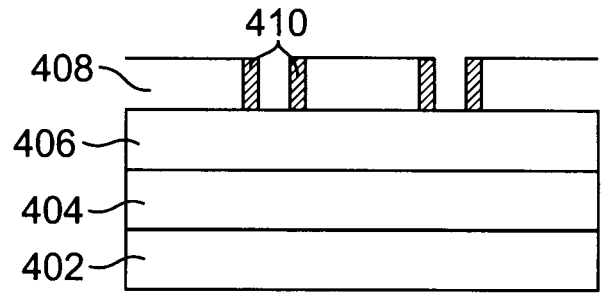

After deposition of the dielectric layer 410, an etching is performed to partially remove the portions of the dielectric layer 410 that are right above the photoresist masks 408 and exposed portions of the isolation layer 406, leaving only portions abutting two opposing sides of each of the photoresist masks 408 as shown in FIG. 4E. These remaining portions form the plurality of non-conducting stress-releasing structures 410. In one embodiment, for defining sharp edges and obtaining controlled width of non-conducting stress-releasing structures 410, an anisotropic etching, such as the plasma or dry etching process, may be used. The etchants may be any one that is known in the art such as $Cl_2$, $CCl_4$, $SiCl_2$, $BCl_3$, $CCl_2F_2$, $CF_4$, $SF_6$, or $NF_3$. In one embodiment, these non-conducting stress-releasing structures 410 generally have a configuration of an elongated rod or strip with a rectangular or square cross section as shown in FIG. 4D. In another embodiment, they may have any other geometrical or polygonal shapes.

Figure 4F:
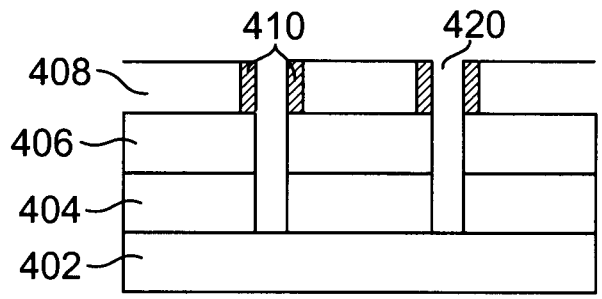

Once the plurality of non-conducting stress-releasing structures 410 is formed by the partial etching, the exposed portions of the isolation layer 406 and the interlayer dielectric layer 404 below are further removed by another etching process, to define a plurality of trenches 420 as shown in FIG. 4F. The etching process stops at the multilayer interconnect structure 402. If necessary, an etch stop layer (not illustrated) may be further used. The etching process used here may either wet etching or dry etching.

Figure 4G:
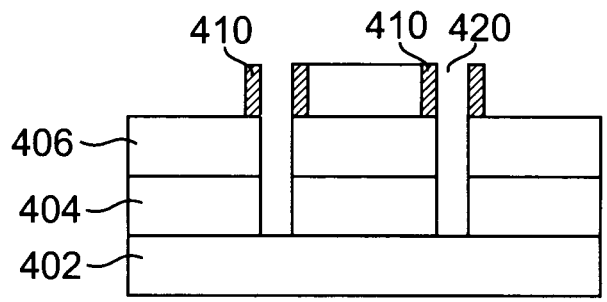
Figure 4H:
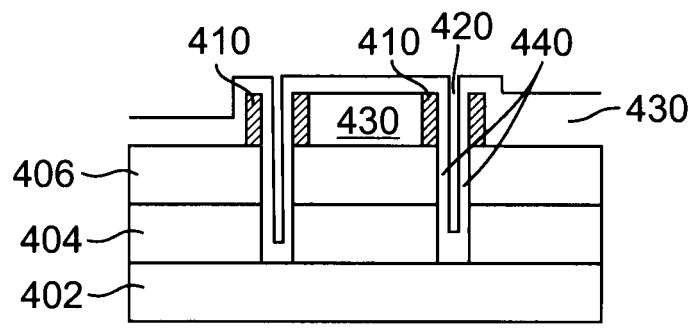

After the etching process, the photoresist masks 408, which are no longer needed, are removed by a process called the ashing. This usually requires a liquid "resist stripper", which chemically alters the resist so that it no longer adheres to the isolation layer 406. Alternatively, the photoresist masks 408 may be removed by a plasma containing oxygen, which oxidizes it. FIG. 4G shows the remaining portions of the structure after the removal of the photoresist masks 408, which include the plurality of non-conducting stress-releasing structures 410.

Referring back to FIG. 3, lastly at step 308, a conductive pad is formed by depositing conductive material over the isolation layer 406, the plurality of non-conducting stress-releasing structures 410, and into the plurality of trenches 420 to form a conductive pad, comprising two portions, 430 and 440 as illustrated in FIG. 4H. The portions 440 of the conductive pad, partially filling the plurality of trenches 420, come directly into physical contact with the top-most conductive lines embedded in the multilayer interconnect structure 402. These vertical portions 440 of the conductive pad, the bridging portion, adjoin the planar portion 430 of the conductive pad generally perpendicularly, extend through the isolation layers 406 and the interlayer dielectric layer 404, and reach all the way down to the multilayer interconnect structure 402 to establish electric contact therewith. The horizontal planar portion 430 forms the bonding pad, to which bonding balls are attached by those processes, described with FIGS. 2A and 2B to establish electrical connections between the image sensor device and external devices. In an embodiment, the conductive material may be a metal or a metal alloy material, for example aluminum (Al) or an aluminum copper alloy (AlCu).

In an embodiment, the conductive material may be deposited upon the radiation-sensor zone and other zones as well, and the planar portion of the conductive layer 430 may be extended to those regions. In that case an etching process may be performed to remove the portion of the conductive layer covering the radiation-sensor zone so that radiation that is supposed to be detected by radiation detecting devices in that zone will not be obstructed by the conductive layer (likely opaque).

FIGS. 5A and 5B show top cross-sectional, and side cross-sectional schematic views, respectively, of a bonding pad structure 500 designed and manufactured by a method describe in FIGS. 3 and 4A-4H in an embodiment of the present disclosure. The bonding pad structure 500 comprises a multilayer interconnect layer 502, an interlayer dielectric (ILD) layer 504, an isolation dielectric layer such as a shallow trench isolation (STI) 506, a plurality of stress-releasing structures 510, and a conductive bonding pad, which comprises a horizontal planar portion 530 disposed upon the STI layer 506 and one or more vertical portions (vias) 540 that extends perpendicularly downward from the horizontal portion 530 to reach the multilayer interconnect layer 502 through the STI layer 506 and ILD layer 504. On the horizontal planar portion 530 of the conductive pad, conducting balls 550, which are made of copper, aluminum, or gold, are bonded for electric connection of the image sensor device to external devices thereby. Each conducting ball 550 may be positioned in the middle of two neighboring stress-releasing structures 510 as shown in FIGS. 5A and 5B for better stress-releasing effect.

The plurality of non-conducting stress-releasing structures 510 is located between the conductive pad, the horizontal planar portion 530, and the isolation dielectric layer 506. It structurally adjoins the planar and bridging portions 530 and 540 of the conductive layer together as shown in FIG. 5B. With such a structure, any potential pulling stress applied on the bonding pad structure would not be concentrated on the horizontal and vertical portions 530 and 540 of the conductive pad, as distinguished from the conventional bonding pad structure illustrated in FIGS. 2A and 2B, but would be dispersed into the plurality of the stress-releasing structures 510 as well. Then, the total stress applied to the conductive pad 530 and 540 would be reduced, and the bonding pad peeling-off or cratering problem described hereinbefore for the conventional bonding pad structure would be prevented.

In one embodiment, the stress-releasing structures 510 may have a shape of a rectangular wall with a rectangular side cross-section, erected around the trenches 520, as illustrated in FIGS. 5A and 5B. But in another embodiment, they could take other shapes having different geometrical cross-sections such as polygons, a circle, or an ellipse.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An image sensor device, comprising:
a substrate having a front surface, a back surface, and a sidewall perpendicular to the front and back surfaces;
a radiation-detection device formed in the substrate, the radiation-detection device being operable to detect radiation waves that enter the substrate through the back surface;
an interconnect structure formed on the front surface of the substrate, the interconnect structure having an extended portion that extends beyond the sidewall of the substrate; and
a bonding pad structure comprising:
an interlayer dielectric layer formed on the extended portion of the interconnect structure;
an isolation layer formed on the interlayer dielectric layer;
a conductive pad having a planar portion formed on the isolation layer, and one or more bridging portions extending generally perpendicularly from the planar portion, through the interlayer dielectric and the isolation layers, and to the interconnect structure for establishing electric contact therewith; and
a plurality of non-conducting stress-releasing structures, wherein the non-conducting stress-releasing structures are disposed vertically between the isolation layer and a portion of the conductive pad and horizontally between the one or more bridging portions and a portion of the conductive pad, and wherein each of the non-conducting stress-releasing structures is fully enclosed by the isolation layer and the conductive pad, and is in direct contact with both the isolation layer and the conductive pad.

2. The image sensor device of claim 1, wherein the image device is a back side illuminated (BSI) image sensor.

3. The image sensor device of claim 1, wherein the plurality of non-conducting stress-releasing structures is made of an oxide material.

4. The image sensor device of claim 1, wherein the plurality of non-conducting stress-releasing structures is made from the same material as the isolation layer.

5. The image sensor device of claim 1, wherein each of the plurality of non-conducting stress-releasing structures has a configuration of a surrounding wall with an opening, through which one of the one or more bridging portions extends to the interconnect structure.

6. The image sensor device of claim 1, wherein the bonding pad structure further comprises a conducting ball bonded with the planar portion of the conductive pad for an electric connection to an external device therethrough.

7. The image sensor device of claim 6, wherein the conducting ball is positioned substantially in the middle of two neighboring non-conducting stress-releasing structures.

8. An image sensor device, comprising:
a substrate having a radiation sensing device and a bonding pad structure, the bonding pad structure comprising:
an interconnect layer;
an interlayer dielectric layer formed on the interconnect layer;
an isolation layer formed on the interlayer dielectric layer;
a conductive pad comprising:
a planar portion formed on the isolation layer, and
one or more bridging portions extending generally perpendicularly from the planar portion, through the interlayer dielectric and isolation layers, and to the interconnect layer for establishing electric contact therewith, wherein there is a trench in the one or more bridging portions; and
a plurality of non-conducting stress-releasing structures disposed vertically between the isolation layer and a portion of the conductive pad and horizontally between the one or more bridging portions and the planar portion of the conductive pad in such a way to adjoin the planar and the bridging portions of the conductive pad together, and wherein the trench is surrounded by one of the non-conducting stress-releasing structures from a top view.

9. The image sensor device of claim 8, wherein the radiation sensing device is on a back side of the substrate.

10. The image sensor device of claim 8, wherein the plurality of non-conducting stress-releasing structures are made of an oxide material.

11. The image sensor device of claim 8, wherein the plurality of non-conducting stress-releasing structures are made of the same material as the isolation layer.

12. The image sensor device of claim 8, wherein the plurality of non-conducting stress-releasing structures generally have a configuration of a rectangular wall.

13. The image sensor device of claim 8, further comprising a conducting ball bonded with the planar portion of the conductive pad for electrically connecting the image sensor device to an external device.

14. The image sensor device of claim 13, wherein the conducting ball is positioned substantially in the middle of two neighboring non-conducting stress-releasing structures.

15. An image sensor device comprising:
a radiation-sensor region having a substrate and a radiation detection device, and a bonding pad region, both of the regions sharing an interconnect layer and an interlayer dielectric layer that are extending across the regions under the substrate;
an isolation layer formed on a portion of the interlayer dielectric layer;
a plurality of non-conducting stress-releasing structures on the isolation layer, wherein each of the non-conducting stress-releasing structures has a configuration of a surrounding wall with an opening extending through an inner surface of the surrounding wall; and
a conductive pad comprising a planar portion overlying the isolation layer and the plurality of non-conducting stress-releasing structures, and one or more bridging portions extending generally perpendicularly from the planar portion, through the opening and through the interlayer dielectric and isolation layers, and to the interconnect layer for establishing electric contact therewith.

16. The device of claim 15, wherein the image sensor device is a back side illuminated (BSI) image sensor.

17. The device of claim 15, further comprising:
a conducting ball with the planar portion of the conductive pad for electrically connecting the image sensor device to an external device therethrough.

18. The device of claim 15, wherein the portion of the interlayer dielectric layer in the bond pad region extends to the radiation-sensor region and the bonding pad region.

19. The device of claim 15, wherein each of the non-conducting stress-releasing structures is fully enclosed by the isolation layer and the conductive pad, and is in direct contact with both the isolation layer and the conductive pad.

20. The device of claim 15, wherein the non-conducting stress-releasing structures are isolated from each other.

* * * * *